(12) United States Patent
Lai et al.

(10) Patent No.: US 9,018,951 B2
(45) Date of Patent: *Apr. 28, 2015

(54) ACCELERATED MULTISPECTRAL DATA MAGNETIC RESONANCE IMAGING SYSTEM AND METHOD

(75) Inventors: Peng Lai, Union City, CA (US); Weitian Chen, Palo Alto, CA (US)

(73) Assignee: General Electric Company, Schenectady, NY (US)

( * ) Notice: Subject to any disclaimer, the term of this patent is extended or adjusted under 35 U.S.C. 154(b) by 979 days.

This patent is subject to a terminal disclaimer.

(21) Appl. No.: 13/089,243

(22) Filed: Apr. 18, 2011

(65) Prior Publication Data

US 2012/0262167 A1   Oct. 18, 2012

(51) Int. Cl.
*G01R 33/48* (2006.01)
*G01R 33/561* (2006.01)
*G01R 33/565* (2006.01)

(52) U.S. Cl.
CPC ...... *G01R 33/5611* (2013.01); *G01R 33/56563* (2013.01)

(58) Field of Classification Search
CPC ........... G01R 33/5611; G01R 33/5619; G01R 33/561; G01R 33/56563
USPC ................................. 324/300–322
See application file for complete search history.

(56) References Cited

U.S. PATENT DOCUMENTS

| | | | | |
|---|---|---|---|---|
| 7,840,045 | B2 * | 11/2010 | Guo et al. | 382/128 |
| 8,502,534 | B2 * | 8/2013 | Lai et al. | 324/309 |
| 2010/0142823 | A1 * | 6/2010 | Wang et al. | 382/195 |
| 2011/0241669 | A1 * | 10/2011 | Chen et al. | 324/309 |

OTHER PUBLICATIONS

Brau, A. C.S., Beatty, P. J., Skare, S. and Bammer, R. (2008), Comparison of reconstruction accuracy and efficiency among autocalibrating data-driven parallel imaging methods. Magn Reson Med, 59: 382-395. doi: 10.1002/mrm.21481.*

Lai, P., Huang, F., Larson, A. C. and Li, D. (2008), Fast four-dimensional coronary MR angiography with k-t GRAPPA. J. Magn. Reson. Imaging, 27: 659-665. doi: 10.1002/jmri.21278.*

Koch, K. M., Brau, A. C., Chen, W., Gold, G. E., Hargreaves, B. A., Koff, M., McKinnon, G. C., Potter, H. G. and King, K. F. First Published: Oct. 27, 2010, Imaging near metal with a MAVRIC-SEMAC hybrid. Magn Reson Med, 65: 71-82. doi: 10.1002/mrm.22523.*

(Continued)

*Primary Examiner* — Melissa Koval
*Assistant Examiner* — Rishi Patel

(57) ABSTRACT

A method for processing magnetic resonance imaging data includes accessing the magnetic resonance imaging data, the data including a plurality of magnetic resonance data sets each collected at different excitation frequencies and defining reconstructable images representative of sections of a single image of a subject. Each magnetic resonance data set includes sampled data for sampled phase encoding points but is missing data for unsampled phase encoding points. The method further includes determining the missing data of at least one of the magnetic resonance data sets using a correlation between the sampled data for the respective magnetic resonance data set and sampled data from at least one other magnetic resonance data set within a spectral window encompassing at least the respective magnetic resonance data set and the at least one other magnetic resonance data set.

18 Claims, 6 Drawing Sheets

(56) References Cited

OTHER PUBLICATIONS

Chen, W., et al. "Parallel MRI near metallic implants." 17th Annual Meeting of the ISMRM. 2009.*

Koch et al., A Multispectral Three-Dimensional Acquisition Technique for Imaging Near Metal Implants, Magnetic Resonance in Medicine 61: 381-390 (2009).

* cited by examiner

ACCELERATED MULTISPECTRAL DATA MAGNETIC RESONANCE IMAGING SYSTEM AND METHOD

TECHNICAL FIELD

The disclosed embodiments relate to magnetic resonance imaging data processing, and more specifically, to methods for synthesizing images from image data resulting from accelerated imaging techniques.

BACKGROUND

In general, magnetic resonance imaging (MRI) examinations are based on the interactions among a primary magnetic field, a radiofrequency (RF) magnetic field and time varying magnetic gradient fields with gyromagnetic material having nuclear spins within the subject of interest. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

The magnetic fields used to generate images in MRI systems include a highly uniform, static magnetic field that is produced by a primary magnet. A series of gradient fields are produced by a set of gradient coils located around the subject. The gradient fields encode positions of individual plane or volume elements (pixels or voxels) in two or three dimensions. An RF coil is employed to produce an RF field. This RF field perturbs the spins of some of the gyromagnetic nuclei from their equilibrium state, causing the spins to process around the axis of their equilibrium magnetization. The spins return to the equilibrium state after the RF field is withdrawn. During this process, RF fields are emitted by the spinning, processing nuclei and are detected by either the same transmitting RF coil, or by a separate coil. These signals are amplified, filtered, and digitized. The digitized signals are then processed using one or more algorithms to reconstruct a useful image.

MRI is sensitive to many of the gyromagnetic nuclei in the human body, such as the hydrogen nuclei in water, fats, proteins, and the like. Therefore, most tissues within a patient are readily imaged. However, for some patients, such as those having metal implants resulting from arthroplastic procedures (e.g., knee replacement, hip replacement), MRI imaging can be problematic. For example, the metal used for some implants can cause significant perturbations in the static magnetic field. This magnetic field perturbation can lead to complications with slice selection as well as frequency encoding processes, which can result in signal contamination and image artifacts. Even though the magnetic field perturbation is typically limited to the vicinity of the implant, many complications resulting from arthroplasty arise within this area. Accordingly, the presence of a metal implant can be prohibitive of the diagnosis of such complications using MRI.

Some techniques have been developed for acquiring sections around the metal implant at discrete frequency offsets that account for the field perturbations. The sections are then combined to generate an image of the tissue surrounding the metal implant. Typically, such techniques may use at least 20 different sections, referred to as "frequency bins," to create a single image. Capturing these bins can sometimes take 20 minutes or longer. Moreover, a patient must remain still during the duration of the acquisition, which, as the acquisition becomes longer, can lead to blurred images resulting from patient movement. To counteract these long-duration acquisition sequences, certain techniques have also been developed for acquiring less than all of the information normally utilized for such image reconstruction, requiring that the absent data be estimated in some way for proper, high quality image creation. However, current techniques for such data acquisition and estimation are often inadequate or subject to further improvement.

BRIEF DESCRIPTION

In accordance with an embodiment, a method for processing magnetic resonance imaging data includes accessing the magnetic resonance imaging data, the data including a plurality of magnetic resonance data sets each collected at different excitation frequencies and defining reconstructable images representative of sections of a single image of a subject. Each magnetic resonance data set includes sampled data for sampled phase encoding points but is missing data for unsampled phase encoding points. The method further includes determining at least a portion of the missing data of at least one of the magnetic resonance data sets using a correlation between the sampled data for the respective magnetic resonance data set and sampled data from at least one other magnetic resonance data set within a spectral window encompassing at least the respective magnetic resonance data set and the at least one other magnetic resonance data set.

In accordance with another embodiment, a method for processing magnetic resonance imaging data includes accessing the magnetic resonance imaging data, the data including a plurality of magnetic resonance data sets representative of a subject at different excitation frequencies, each magnetic resonance data set including sampled data for sampled phase encoding points but missing data for unsampled phase encoding points to form a sampling pattern for each magnetic resonance data set, and the sampling pattern of excitation frequency-adjacent magnetic resonance data sets differ from one another. The method also includes determining at least a portion of the missing data of at least one of the magnetic resonance data sets using a correlation between the sampled data for the respective magnetic resonance data set and sampled data from at least one other magnetic resonance data set within a spectral window encompassing at least the respective data set and the at least one other data set.

In accordance with a further embodiment, a magnetic resonance imaging method includes acquiring a plurality of frequency bins using an excitation frequency progression, wherein each of the frequency bins is collected at a unique excitation frequency. Each bin includes a magnetic resonance data set representative of a section of a subject, and each data set includes a sampling pattern having sampled locations for sampled phase encoding points and unsampled locations for unsampled phase encoding points, and the sampling patterns interleave in k-space along the excitation frequency progression to form a desired pattern. The method further includes storing the magnetic resonance data sets.

In accordance with another embodiment, a magnetic resonance imaging (MRI) apparatus includes an MRI system having a plurality of gradient coils positioned about a bore of a magnet, and an RF transceiver system and a RF switch controlled by a pulse module to transmit RF signals to an RF coil assembly to acquire MR images and a computer programmed to access a plurality of magnetic resonance data sets, each magnetic resonance data set acquired at a different excitation frequency and including at least a set of accelerated data, determine a set of synthesized data for unacquired phase-encoding points for at least one of the magnetic resonance data sets using a correlation between sampled data in the set of accelerated data for the respective magnetic resonance data set and sampled data from the set of accelerated data for at least one other magnetic resonance data set within a spectral window including at least the respective magnetic resonance data set and the at least one other magnetic resonance data set and generate an image using the accelerated data and the set of synthesized data for the respective magnetic resonance data set.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
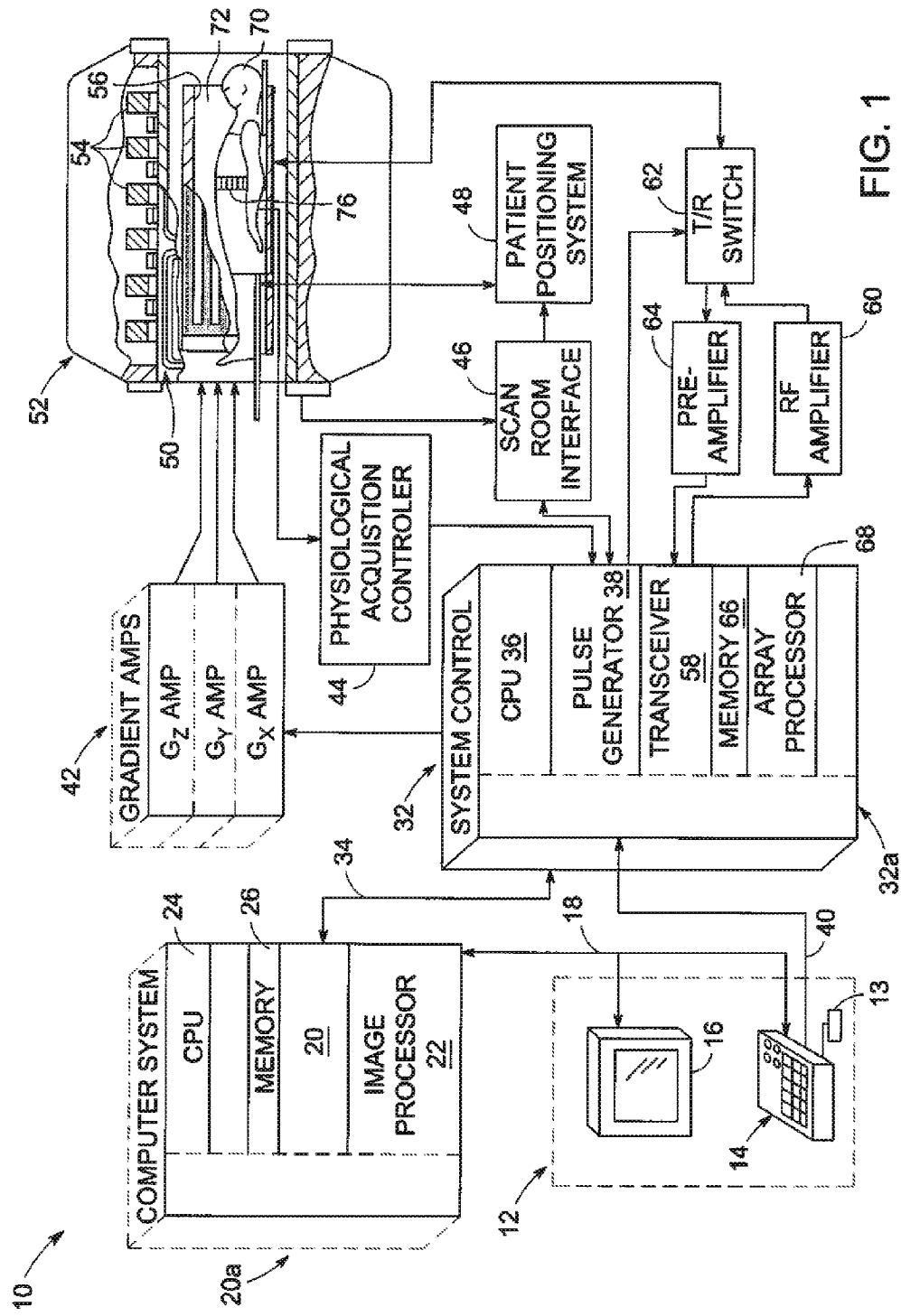
FIG. 1 is a schematic block diagram of an exemplary magnetic resonance imaging system in accordance with an embodiment.

In accordance with aspects of the present disclosure, an imaging technique is employed that is able to accelerate multispectral MRI by exploiting spectral correlations between images or sections of images collected at varying excitation frequencies. The acquisitions in accordance with certain embodiments collect less than all information normally used for image reconstruction. The acceleration is identified as the total number of sampled data points divided by the number of data points needed for the user prescription (e.g. spatial resolution, FOV). For uniform data sampling, the acceleration along a phase-encoding direction can be determined by the number of consecutive data points not sampled in between each pair of sampled data points along that phase-encoding direction in a magnetic resonance data set. For example, in a single k-space data set representative of an image, three unsampled data points in between each pair of sampled data points could be described as having an acceleration factor of 4. That is, every fourth point is sampled. Four unsampled points in between each sampled pair could be described as having an acceleration factor of 5 wherein every fifth point is sampled, and so on. In some embodiments, the acceleration factor along a phase encoding direction may not necessarily be fixed. As an example, the sampling pattern along $k_y$ may include an acceleration of 4, followed by an acceleration of 2, which is then followed by an acceleration of 3, and so on.

As noted above, the magnetic resonance data is collected using varying excitation frequencies. The data is grouped into separate frequency bins, which separate the magnetic resonance data based on the unique excitation frequency used to collect a particular set of data. Each bin may have data relating to a section of an anatomy of interest, such as a portion of a knee that is proximate a metal implant. In this way, one frequency bin contains $k_x$, $k_y$, and $k_z$ information collected using a single excitation frequency, and may be reconstructed to form an image of the section. Indeed, the acceleration techniques described herein may be performed in conjunction with multi-acquisition variable-resonance image combination (MAVRIC), as described by Koch et al. in "A Multispectral Three-Dimensional Acquisition Technique for Imaging Near Metal Implants," Magnetic Resonance in Medicine 61: 381-390 (2009), which is incorporated by reference herein in its entirety. However, the acceleration techniques described herein are not limited to such imaging techniques. Indeed, any acquisition of a series of images or data sets having varying excitation frequencies may benefit from the embodiments described herein.

When the acquisition of the frequency bins described above is accelerated, not every phase encoding point is sampled within each frequency bin. Therefore, performing image reconstruction on these bins results in image aliasing. According to certain presently contemplated embodiments, unaliased images may be generated for the data set within each bin by synthesizing (i.e., estimating) the missing data using source data sampled at the same excitation frequency ($f_n$) as the data set of interest (i.e., in the same bin) and adjacent excitation frequencies ($f_{n\pm x}$), (i.e., data within a separate frequency bin). In other embodiments, the source data used for the data estimation may only include data from frequency-adjacent bins.

To estimate the missing data, a weighted summation is performed using the source data, and the weight given to the source data is dependent on a correlation between the data set that is used for the summation and the data set for which the missing data is being estimated. To improve such a correlation, undersampling in k-space in accordance with the present embodiments is frequency-interleaved. The source data that is used for the weighted summation may come from any number of adjacent frequency bins, and may be defined using a spectral window. The spectral window may be calculated for each frequency bin (i.e., the spectral window may be adaptive), or the spectral window may be the same for each frequency bin. In embodiments in which the spectral window is adaptive, the spectral window may be determined for each frequency bin by comparing the correlation mentioned above and select the adjacent spectral bins with the highest correlation. Indeed, the determination of the correlation between frequency-adjacent and/or frequency-proximate frequency bins, as well as the data reconstruction using the same, may be performed in accordance with some or all of the embodiments described in U.S. patent application Ser. No. 12/751,901 by Lai et al. entitled "ACCELERATED DYNAMIC MAGNETIC RESONANCE IMAGING SYSTEM AND METHOD" filed on Mar. 31, 2010, which is incorporated by reference herein in its entirety.

The embodiments described herein may be performed by a magnetic resonance imaging (MRI) system, wherein specific imaging routines (e.g., accelerated imaging routines) are initiated by a user (e.g., a radiologist). Further, the MRI system may perform data acquisition, data construction, and image synthesis. FIG. 1 is a schematic block diagram of an exemplary magnetic resonance imaging system in accordance with an embodiment. The operation of MRI system 10 is controlled from an operator console 12 that includes a keyboard or other input device 13, a control panel 14 and a display 16. The console 12 communicates through a link 18 with a computer system 20 and provides an interface for an operator to prescribe MRI scans, display the resultant images, perform image processing on the images, and archive data and images. The computer system 20 includes a number of modules that communicate with each other through electrical and/or data connections, for example such as are provided by using a backplane 20a. Data connections may be direct wired links or may be fiber optic connections or wireless communication links or the like. The modules of computer system 20 may include an image processor module 22, a CPU module 24 and a memory module 26 that may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer systems or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., imaging assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests (e.g., radio frequency (RF) waveforms) describing the timing, strength and shape of the RF pulses and pulse sequences to be produced and the timing and length of the data acquisition window. The pulse generator module 38 connects to a gradient amplifier system 42 and produces data called gradient waveforms which control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of Gx, Gy and Gz amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of an imaging assembly 52 that includes a polarizing magnet 54 and a whole-body RF coil 56, surface or parallel imaging coils 76 or both. The coils 56, 76 may be configured for both transmitting and receiving or for transmit-only or receive-only. A patient or imaging subject 70 may be positioned within a cylindrical patient imaging volume 72 of the imaging assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the coil during the receive mode. The transmit/receive switch 62 can also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. Typically, frames of data corresponding to MR signals are stored in the memory module 66 until they are subsequently transformed to create images. An array processor 68 uses a known transformation method, most commonly a Fourier transform, to create images from the MR signals. System control computer 32 (and/or computer 20) may also be configured to perform an image reconstruction process as described further below. The images are communicated through the link 34 to the computer system 20 where it is stored in memory. In response to commands received from the operator console 12, this image data may be archived in long term storage or it may be further processed by the image processor 22 and conveyed to the operator console 12 and presented on display 16.

As noted above, the MRI system 10 may be used to perform sequences in which a plurality of images is obtained using variable excitation frequencies. For example, in an imaging sequence in which no metal is present in a tissue of interest, the RF transmission pulse used to excite certain nuclei within the tissue may be performed at a single desired frequency (i.e., an on-resonance frequency). However, in an imaging sequence in which a metal is present in the tissue of interest, other RF pulses may be performed at discrete offset frequencies from the on-resonance frequency to generate a plurality of datasets at different frequency bins. This allows the generation of multiple images at different frequencies, which can be combined to produce an image of the tissue surrounding or proximate the metal implant. The frequency offsets may be defined based on their deviation from the on-resonance frequency, and can vary from well below the on-resonance frequency to well above the on-resonance frequency. As an example, the offsets may vary from approximately 10 kHz below the on-resonance frequency to approximately 10 kHz above the on-resonance frequency. The progression from the lowest frequency in the series to the highest frequency in the series may be considered as the frequency progression.

Figure 2:
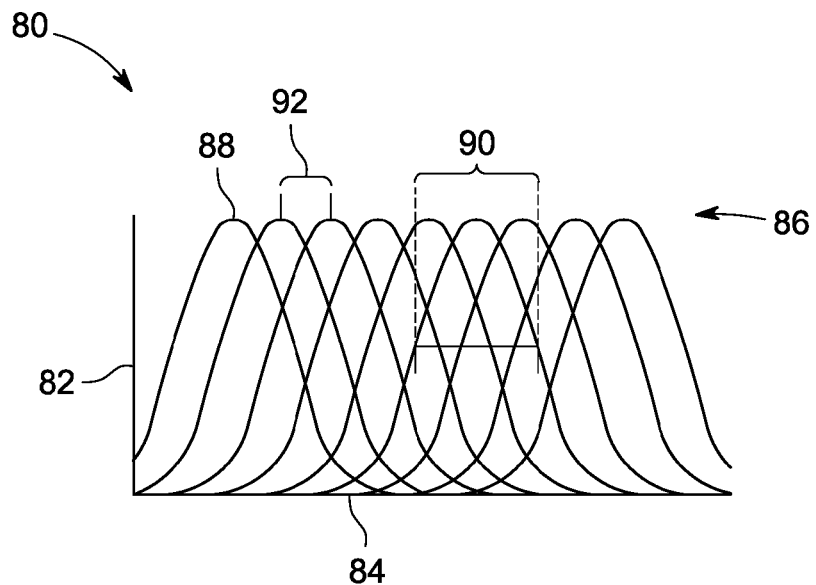
FIG. 2 is a plot of a plurality of excitation frequency bands used in a multispectral MRI acquisition for generating a plurality of frequency bins.

FIG. 2 illustrates an embodiment of plot 80 of a frequency progression that is used to produce an array of frequency bins. Specifically, the plot 80 depicts spin response 82 as a function of frequency 84 for a plurality of excitation emission bands 86. Each excitation emission band 86 includes a respective maximum 88 corresponding to a desired excitation frequency, and a spectral bandwidth, which may be measured at a full width at half maximum (FWHM) 90. The respective maxima 88 between emission bands (i.e., between neighboring frequency bins) is separated by a predetermined offset 92, which is smaller than the FWHM 90 for each band. Because of this relationship, there is a frequency overlap between neighboring excitation bands. This frequency overlap leads to spectral correlations between neighboring frequency bins, which are exploited using the approaches described herein to enable the acceleration of data acquisition in multispectral MRI sequences.

The magnitude of the predetermined offset 92 may be determined by the number of frequency bins that are desired as well as the magnitude of the frequency progression. For example, in an embodiment in which the frequency progression is 20 kHz, i.e., 10 kHz below the on-resonance frequency to 10 kHz above the on-resonance frequency, and if 20 bins are desired, then the offset 92 may be approximately 1 kHz. While the frequency shift from one excitation band to another may be regular (i.e., evenly spaced), it should be noted that irregular spacing may be used as well, provided there is some frequency overlap between excitation bands to allow spectral correlation. Moreover, it should be noted that the bandwidth (e.g., FWHM 90) of each excitation band 86 may also be manipulated to satisfy this relationship. In the illustrated embodiment, the FWHM 90 for each of the plurality of bands 86 is approximately 2.25 kHz.

Figure 3:
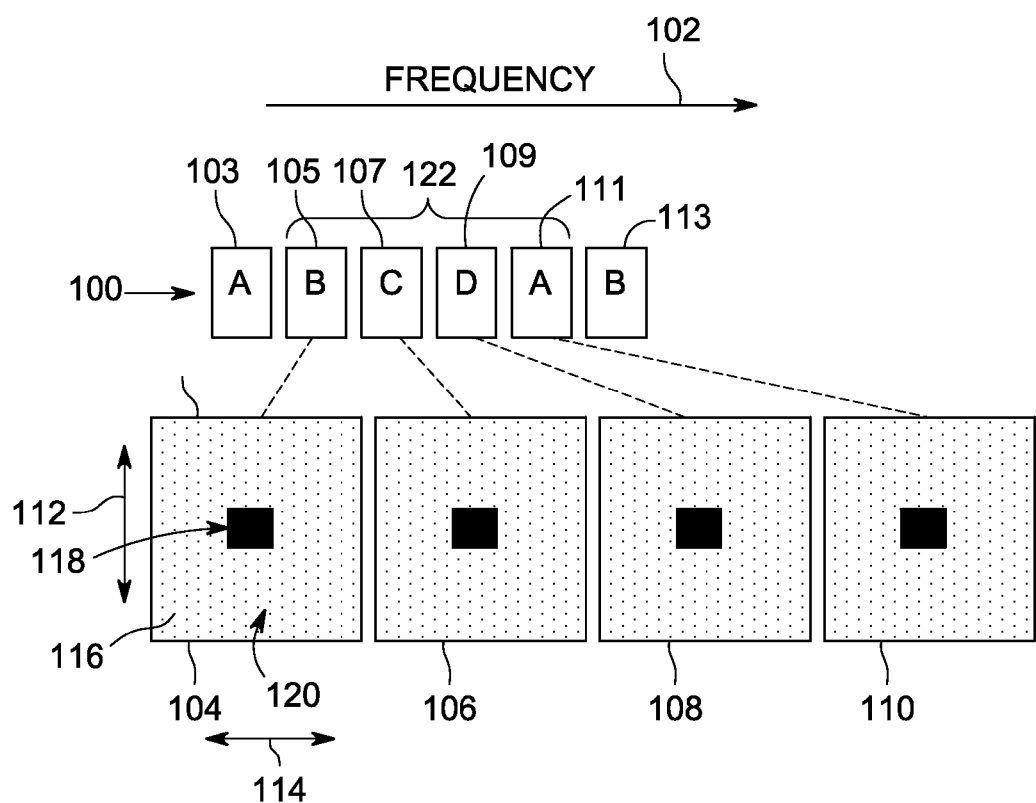
FIG. 3 is a schematic illustration of a plurality of frequency bins generated from a multispectral MRI acquisition sequence, the bins having data sets with fully sampled data and sparsely sampled data.

As noted above, the magnetic resonance data that is collected by using the plurality of excitation frequency bands 86 are grouped into frequency bins, where each frequency bin corresponds to the data collected from a single excitation band. Frequency bins in succession (i.e., proximate one another) denote frequency neighbors. FIG. 3 illustrates an embodiment of a group of frequency bins 100 resulting from a multispectral MRI acquisition sequence collected using a frequency progression 102. Specifically, the sampling pattern and sampled data for the group of bins 100 is illustrated as including a first bin 103 with a phase-encoding sampling pattern illustrated as "A," a second bin 105 with a sampling pattern illustrated as "B," a third bin 107 with a sampling pattern illustrated as "C," and a fourth bin 109 with a sampling pattern illustrated as "D." It should be noted that as different frequency bins are collected, these sampling patterns may be repeated. For example, N number of patterns may be used for a given acquisition. In this way, for every N frequency bins collected, a desired sampling coverage may be obtained. Therefore, FIG. 3 also illustrates a fifth bin 111 also having the sampling pattern A and a sixth bin 113 also having the sampling pattern B. As noted above, the excitation bands used to acquire each of the frequency bins may overlap to some predetermined extent. This overlap is used to identify a relationship between the data in each bin.

Each bin, as noted above, includes a set of magnetic resonance data that has been collected using a certain excitation frequency. In the illustrated embodiment, the second bin 105 includes a first set of data 104, the third bin 107 includes a second set of data 106, the fourth bin 109 includes a third set of data 108, and the fifth bin 111 includes a fourth set of data 110. In accordance with certain of the present embodiments, the data sets have been collected using an accelerated acquisition. Therefore, each of the sets of data includes a sampling pattern including locations that are sampled (i.e., locations with sampled phase encoding data) and locations that are not sampled (i.e., locations with no sampled phase encoding data). The sampling patterns for each bin may be predetermined (i.e., a regular pattern) or may be substantially random while meeting some predefined requirement (i.e., a pseudo-random pattern). The data sets 104, 106, 108, 110 each illustrate phase encoding planes, with the axes representing $k_y$ 112 and $k_z$ 114, $k_x$, i.e., the readout direction, may be considered to extend perpendicularly relative to the phase encoding plane. Therefore, each sampled location 116 illustrated in each of the data sets may correspond to a sampled line in k-space, and each unsampled location corresponds to a line within k-space that is unfilled.

In accordance with certain embodiments, the frequency overlap between excitation bands used to collect the data within the frequency bins results in data that can be correlated for frequency-adjacent (i.e., frequency-neighboring) bins. Such correlations may then be used to synthesize missing data within the bins. For example, a portion of the magnetic resonance data within the second bin 105 may be correlated to a portion of the magnetic resonance data within the third bin 107. This enables the portion of the data within the second bin 105 to be used to estimate missing data within the third bin 107. To quantify the correlation between two bins, a comparison between the bins is made using autocalibration signals 118 contained within each bin. In the illustrated embodiment, the autocalibration signals 118 for each data set includes a fully-sampled area at the center of k-space. Because the center of k-space contains information suitable for generating a low-resolution image, the autocalibration signals 118 can be processed to generate images that can then be compared. This comparison may be useful to synthesize missing data within a sparsely-sampled area 120 of a data set. The comparison may be a mathematical comparison between the signals or between the images.

Specifically, when synthesizing missing data within a frequency bin, a comparison is made between the autocalibration signals 118 within the frequency bin (i.e., the bin of interest) and the autocalibration signals 118 within other frequency bins. For example, to synthesize missing data within the third bin 107, the auotcalibration signals 118 within the third bin 107 are compared to the auotcalibration signals 118 within all of the other frequency bins. In certain embodiments, this comparison is used to assign a correlation factor or a weight to the data within each bin relative to the bin of interest (in this example, relative to the third bin 107). In some embodiments, this correlation may also be used to determine a spectral window 122 that defines which bins may be used to synthesize missing data within a bin of interest.

Broadly, the consistency between a frequency bin of interest (e.g., the third bin 107) and a frequency neighbor (e.g., the first, second, and/or fourth bins) may be represented by a calculated deviation between the two, which may be used to define the spectral window 122. That is, the calculated deviation may represent the extent that an image of a section of a tissue overlaps with another image of another section of the tissue. In one embodiment, the deviation may be calculated as the deviation between the total auotcalibration signals 118 of each frequency neighbor with the total auotcalibration signals 118 of the frequency bin of interest. That is, by performing a k-space or image space subtraction of the auotcalibration signals 118 between a pair of frequency bins, the consistency between them may be estimated. In some embodiments, the deviation may be calculated as a norm function of the k-space data difference. For example, if determined in k-space, the deviation may be calculated using the following equation:

$$DEV_{n,m} = \sum_{l} \sum_{k_x k_y} \|F_{n,l}(k_x, k_y) - F_{m,l}(k_x, k_y)\|^2 \quad (1)$$

where $F_{n,l}(k_x, k_y)$ is the autocalibration signals 118 for each frequency bin, n and m are phase indices, and l is the coil index. In some embodiments, the spectral window 122 may be calculated for portions of each frequency bin, rather than substantially only the lower phase encoding values. In such embodiments, each frequency bin could encompass one or more spectral windows 122 having fully sampled autocalibration signals in areas not limited to any one portion (e.g., the center) of the data space. Further, the data sets for each frequency bin may include more than one set of autocalibration signals. For example, the data sets could contain fully sampled autocalibration signals at the center and the periphery of the data space, or at mid-range frequencies. Indeed, the present approaches are applicable to all data sets having autocalibration signals for which a spectral correlation can be made.

Figure 4:
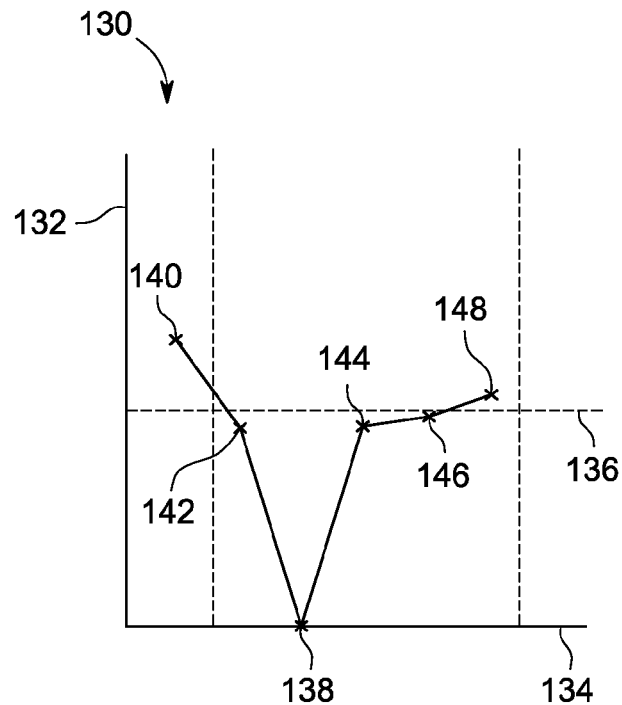
FIG. 4 is a plot of deviations between frequency-neighboring frequency bins and a frequency bin of interest.

To determine a frequency bin-specific spectral window, the calculated deviations between data sets within each of the frequency bins may be represented as a plot of calculated deviation versus frequency shift. FIG. 4 is an illustration of one such plot 130 of calculated deviation 132 versus frequency shift 134. Additionally, a threshold deviation 136 is illustrated as a cutoff value to determine the spectral window 122. That is, the spectral window 122 includes all frequency bins having a deviation value at or below the threshold deviation 136. According to certain embodiments, the threshold deviation 136 is defined as the median value of calculated deviation (using, for example, equation (1)) between the data set within the bin of interest (e.g., the third bin 107) and the other frequency bins. However, in other embodiments, the threshold deviation 136 may be a mean of the calculated deviations, a mode of the calculated deviations, the n-th smallest number of the calculated deviations in the respective frequency bin neighborhood, and so forth. For example, in certain embodiments, a fixed width of frequency bins (e.g., 4) may be used for the spectral window 122. In such embodiments, frequency bins having the highest correlation with the target bin are included in the fixed width.

The data set within the frequency bin of interest is the data set 106 within the third bin 107. In the illustrated embodiment of FIG. 4, the deviation has been calculated for a point 138, which is representative of the data set 106 within the third bin 107. Accordingly, the point 138 may be considered to be at a position of (0, 0) within the plot 130 (i.e., there is no deviation). As noted above, the threshold deviation 136 determines which frequency-adjacent bins are included within the spectral window 122 calculated for the third bin 107. For example, in the illustrated embodiment a point 140 is representative of a calculated deviation of a rejected preceding frequency neighbor (i.e., a rejected set of data collected using a lower frequency than the frequency used for the third bin 107). That is, the point 140 is above the threshold deviation 136 and thus, its respective data set is not included within the spectral window 122. In the present example, the rejected preceding frequency neighbor is the first bin 103 and the rejected data set is data set 104.

Conversely, the plot 130 also includes a point 142 that is representative of a calculated deviation of an accepted preceding frequency neighbor. In the illustrated embodiment, the point 142 is representative of the deviation of the second bin 105 from the third bin 107 (FIG. 3). Points 144 and 146 are representative of calculated deviation values for accepted subsequent frequency neighbors (i.e., accepted data collected at higher frequencies than the data in the frequency bin of interest). In the present embodiment, the accepted subsequent frequency neighbors 144 and 146 are the data set 108 in frequency the fourth bin 109 and the data set 110 in the fifth bin 111 (FIG. 3). In a similar manner to point 140, point 148 is representative of a calculated deviation between a rejected subsequent frequency neighbor and the data set of interest, i.e., the data set 106 in frequency the third bin 107. Based on the plot 130, the spectral window 122 that defines the frequency bins that will be used for the estimation of missing data in frequency the third bin 107 includes the data set 104 in the second bin 105, the data set 108 in the fourth bin 109, and the data set 110 in the fifth bin 111. As noted above, various sampled data within the data set 106 in the third bin 107 (i.e., the data set of interest) may also be used in the estimation process.

In addition to determining which data may be used for estimation, the autocalibration signals 118 are also useful in determining weights of the data within the frequency neighbors used in the estimation. Therefore, once the frequency window 122 has been defined for the frequency bin of interest (e.g., the third bin 107) using the method described above or by defining a fixed frequency window for all bins, the missing data within the third bin 107 is able to be constructed by interpolation (e.g., weighted summation). The interpolation involves using immediately adjacent phase encoding neighbors and a sampled phase encoding point that has been sampled at the same position as a missing data point that will be synthesized, i.e., a target data point.

Figure 5:
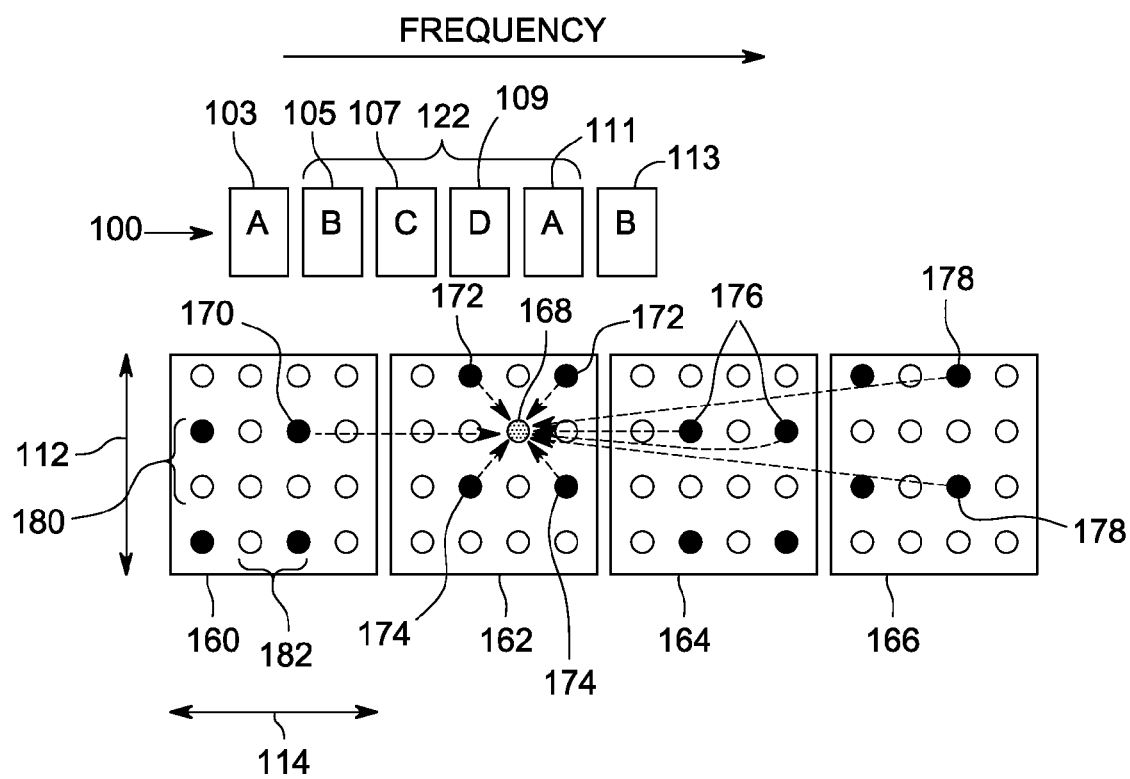
FIG. 5 is a schematic illustration of data interpolation for synthesizing missing data using source data from a plurality of frequency-neighboring frequency bins.

The auotcalibration signals 118 are used to determine the relative weight given to each data synthesis point. Referring to FIG. 5, the frequency progression 102 and the plurality of frequency bins 100 of FIG. 3 is depicted, and expanded regions 160, 162, 164, 166 of each of the respective data sets 104, 106, 108, 110 falling within the spectral window 122 are also illustrated. More specifically, an expanded view of areas having sparsely sampled data, and the manner in which is this data is used for interpolation is provided for each of the data sets. In the illustrated embodiment, region 162 of the third bin 107 contains a target data point 168. The target data point 168 is a location for which phase encoding data has not been collected, and represents an unfilled line in k-space.

Target data point 168 is proximate eight phase encoding neighbors, or points representing phase encoding locations that are next to the target data point 168. Four of these phase encoding neighbors are sampled, and four are not. The four sampled phase encoding neighbors that are in the same bin as the target data point 168, i.e., are in region 162, are used in the synthesis of target data point 168. It should be noted that in some embodiments, neighbors that are not initially sampled may be used for reconstruction after they are synthesized. For example, the reconstruction of certain data points may be an iterative process wherein each data point is initially constructed. The constructed data point may then be refined using the data that is initially sampled as well as other data points that have been reconstructed. Therefore, each target point may be synthesized using only sampled points or a combination of sampled points and synthesized points in an iterative process. Additionally, sampled points in other bins (i.e., bins within the spectral window 122) having k-space locations close or equal to the target data point 168 are used for the data synthesis.

In total, in this example, the target data point 168 is constructed using nine (9) weighted phase encoding points, including eight (8) phase encoding neighbors and a matched phase encoding point 170. In the illustrated embodiment, the target data point 168 is constructed using the matched phase encoding point 170 that has been sampled at the same position on the $k_y$ and $k_z$ axis as the target data point 168, but at a preceding excitation frequency, i.e., the second bin 105. Additionally, the target data point 168 is constructed using four excitation frequency-matched phase encoding points, as noted above. Accordingly, a pair of excitation frequency-matched higher phase encoding neighbors 172 and a pair of excitation frequency-matched lower phase encoding neighbors 174 are used as weighted inputs for interpolating the target data point 168. The spectral window 122, defined for the third bin 107, also includes two subsequent excitation frequency neighbors, including region 164 of the fourth bin 109 and region 166 of the fifth bin 111. Accordingly, lateral phase encoding neighbors 176 within the region 164 of the fourth bin 109 along with a pair of vertical phase encoding neighbors 178 within the region 166 of the fifth bin 111 are used as weighted inputs for interpolating the target data point 168. The weighting factor for each input may, in some embodiments, be related to the deviation calculation described above with respect to FIG. 4. However, in other embodiments, the weighting factor may relate to a correlation between certain locations within the auotcalibration signals 118 of bins within the spectral window 122.

Generally, the weight given to each of the inputs for interpolation may be determined by the correlation of their respective data sets with the data set contained within the frequency bin of interest. The weights are thus determined by comparing the auotcalibration signals 118 for each data set, as noted above. In one embodiment, the pattern of sampled phase encoding data points relative to the target data point 168 may be used for determining the weight of each sampled data point that is used as an input for interpolation. For example, the pattern of the neighboring, sampled phase encoding points as they relate to the target data point 168 may determine which points within the autocalibration signals 118 are compared. In one weight calculation method, the pattern relating to the interpolation used for the synthesis of the target data point 168 may be superimposed on the auotcalibration signals 118. For example, to determine the weight of data points 176 for the synthesis of target data point 168, the sampled point within the auotcalibration signals 118 of the third bin 107 corresponding to the position of the target data point 168 may be compared to the sampled points within the auotcalibration signals 118 of the fourth bin 109 corresponding to the positions of the data points 176. The correlation between these sampled phase encoding points in the autocalibration signals 118 may at least partially, determine the weight given to the lateral phase encoding neighbors 176 during synthesis of the target data point 168.

According to the present approaches, the degree to which a multispectral imaging routine is accelerated, from a data acquisition standpoint, is dependent on the ratio of unsampled phase encoding points to sampled phase encoding points, i.e., the acceleration factor. For regular sampling, the acceleration factor for the frequency series of data sets 100 includes two one-dimensional accelerations. That is, the acceleration factor for the frequency series 100 is a two-dimensional acceleration, with one acceleration being along the vertical, or $k_y$ axis 112, and the other being along the horizontal, or $k_z$ axis 114. Accordingly, in FIG. 5, one accelerated dimension is a $k_y$ phase encoding acceleration 180, and the other is a $k_z$ phase encoding acceleration 182. For both of the $k_y$ and $k_z$ phase encoding accelerations 180 and 182 depicted in FIG. 5, there is one unsampled data point in between each pair of sampled phase encoding data points, resulting in an acceleration factor of 2 for each. Therefore, the acceleration factor for the frequency series 100 may be represented as a two-dimensional acceleration factor of (2×2).

Figure 6:
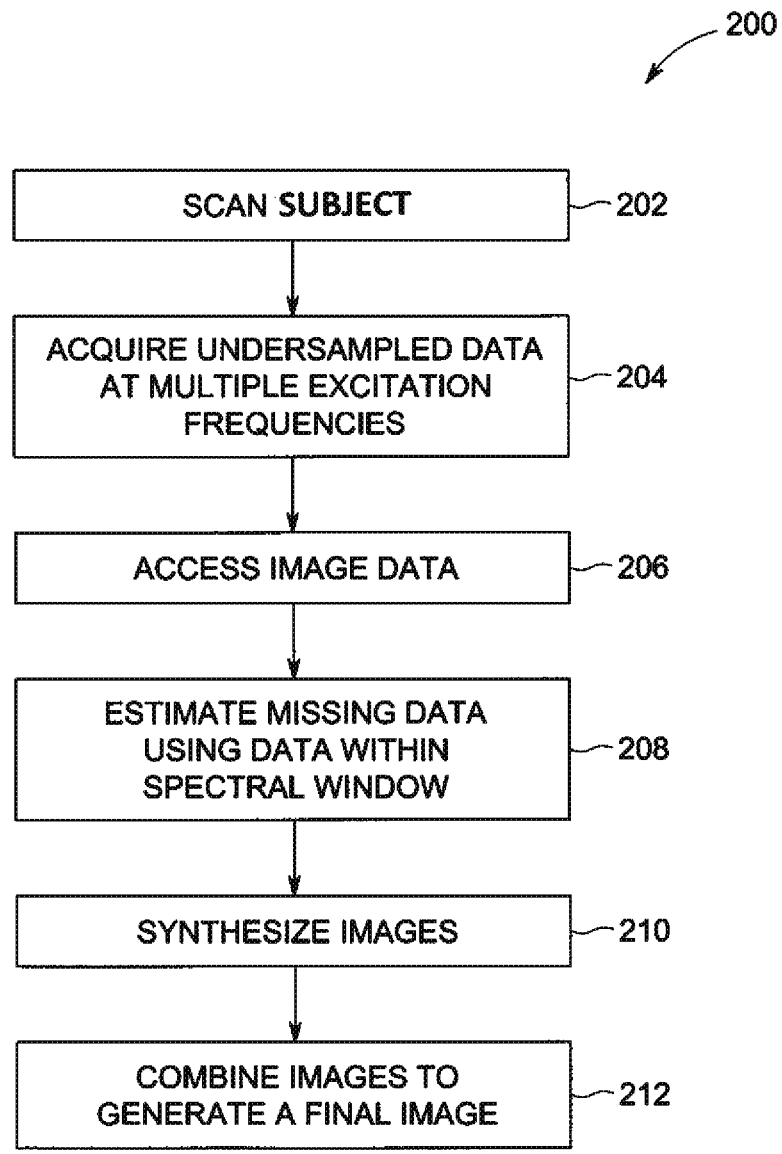
FIG. 6 illustrates a method of accelerated multispectral imaging in accordance with an embodiment.

According to the present disclosure, the representative arrays, plots, and frequency series described above with respect to FIGS. 3-5 are representative of data sets acquired and/or stored on an imaging system, such as the imaging system 10 illustrated in FIG. 1. It should be noted that the processes of spectral window determination, missing data reconstruction, image synthesis, and so forth may be performed by one or more processing components of the system 10. For example, the computer system 20 and system control 32 depicted in FIG. 1 may perform accelerated imaging sequences and image data reconstruction, respectively. Accordingly, the system 10 may be configured to perform a method of MR imaging, which is illustrated in FIG. 6. Specifically, FIG. 6 illustrates a method 200 of MR imaging using an accelerated data acquisition imaging routine in accordance with an embodiment.

In FIG. 6, a subject is scanned at block 202, for example to encode positional information into one or more gyromagnetic materials within the subject (e.g., the hydrogen within fluids and/or tissues, an injected contrast agent) and to receive signals representative of the encoding in a controlled manner. It should be noted that in certain embodiments, there may be no slice selection gradient pulse. At block 204, an accelerated data acquisition process is carried out wherein undersampled magnetic resonance data sets are acquired at multiple excitation frequencies to generate a plurality of frequency bins. The undersampled magnetic resonance data sets within each bin may be sent to and stored on a hard drive, optical storage medium, non-volatile memory, or similar storage device. The data in the frequency bins may then be accessed at block 206 by a user (e.g., a radiologist) with software or automatically by software having one or more algorithms for performing data analysis, data construction, and image synthesis.

Once the image data has been accessed at block 206, the missing data within the frequency bins are then constructed using a spectral window 122 at block 208, which may be calculated for each frequency bin, as described with respect to FIG. 4 above, or may be pre-defined. That is, after the data has been accessed, the sampled data of the frequency bins within the spectral window 122 are then used to fully fill the data space at block 208. Using the magnetic resonance data sets having reconstructed data points, representative images for each of the frequency bins are then synthesized at block 210. For example, an inverse Fourier transform may be performed on the fully-filled data space to generate the respective images. After the respective images have been synthesized, the images, which may be sections of a tissue of interest, are combined to generate a final image at block 212. In one embodiment, the images may be combined by performing a sum-of squares combination of the image data, and the final image may be generated by taking a square root of the combination. As one example, the images may be representative of different sections of a knee or a hip that has undergone arthroplasty. In this example, the final image would be representative of the knee or hip, and would have a dark area corresponding to the placement of a metal implant from the arthroplastic procedure.

Figure 7:
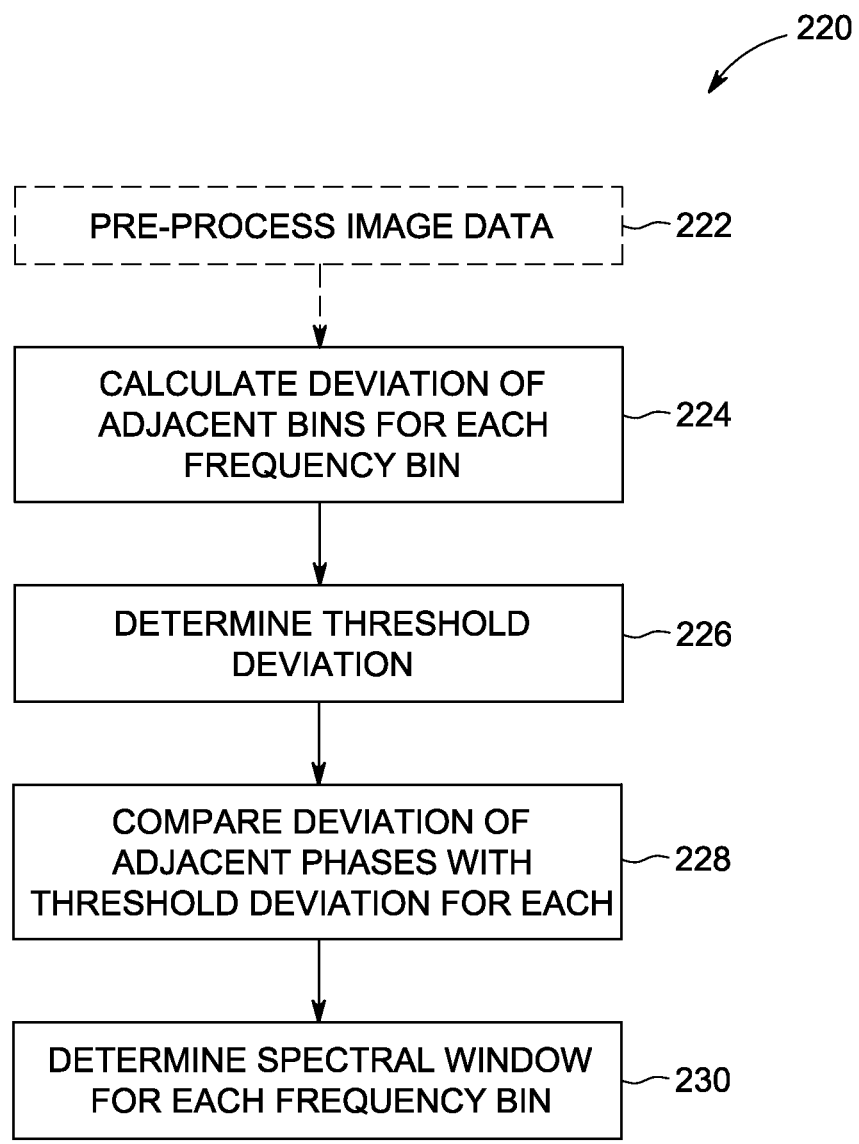
FIG. 7 illustrates a method of determining an adaptive spectral window in accordance with an embodiment.

As noted above, to construct the missing data within each frequency bin, a bin-specific spectral window, such as spectral window 122 may be determined. The spectral window determination, as mentioned, may be performed by one or more processing components within the system 10 illustrated in FIG. 1. FIG. 7 illustrates a method 220 for determining spectral windows for each frequency bin resulting from a multispectral acquisition in accordance with an embodiment. To begin the method 220, the magnetic resonance data (e.g., the frequency-interleaved phase encoding data illustrated in FIG. 3) may optionally be pre-processed at block 222. For example, each data set (e.g., data sets 104, 106, 108, 110) may be transformed from k-space to hybrid space, or from k-space to image space. Once the data is in a desired form, deviations are calculated at block 224 in image space, hybrid space, or k-space for every data set in relation to every other data set within the frequency progression 102. The threshold deviation is then determined at block 226 based on the deviations that are calculated. For example, the threshold deviation may be a median of the deviations, a mode of the deviations, a mean of the deviations, the n-th smallest number of the deviations, and so on. After the threshold deviation has been determined at block 226, the deviations calculated for each data set (i.e., frequency bin) are compared to the threshold deviation at block 228 to determine which neighboring frequency bins are acceptable for inclusion within the spectral window for each frequency bin at block 230.

Figure 8:
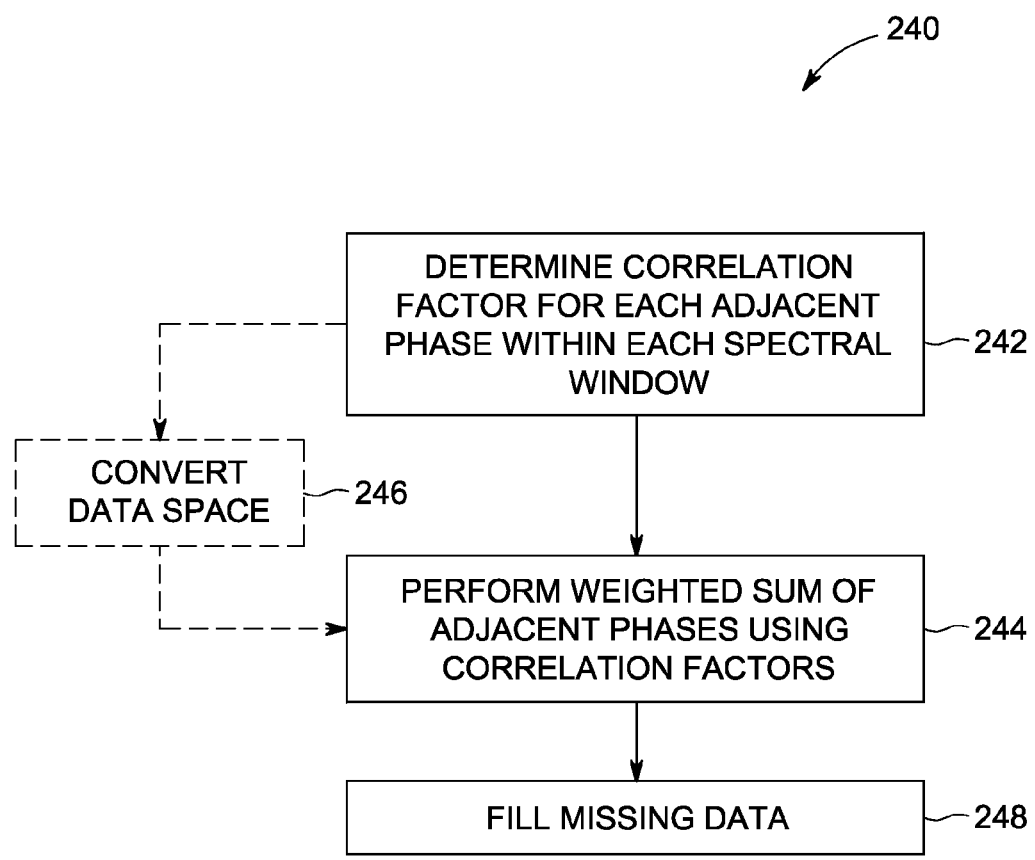
FIG. 8 illustrates a method of synthesizing missing data within a frequency bin acquired in an accelerated multispectral imaging sequence in accordance with an embodiment.

Once a spectral window has been determined for each data set (i.e., each frequency bin), missing data within each of the bins can be constructed using, for example, phase encoding neighbors from the same and/or excitation frequency-adjacent data sets within their respective spectral windows. However, it should be noted that while presently described in the context of an adaptive window, the present embodiment is also applicable to implementations where a fixed window is predetermined for each or all frequency bins. Accordingly, the present approaches provide a method 240, illustrated in FIG. 8, of constructing missing data within the frequency bins using the spectral windows determined in method 220. For example, the spectral window 122, as described with respect to FIGS. 3-5, is determined for each frequency bin by calculating deviations between autocalibration signals of a frequency-adjacent frequency bin and the frequency bin of interest. Pattern-driven correlation methods relating to the autocalibration signals 118 are then used to determine correlation factors for every adjacent phase encoding point as they relate to each target data point at block 242.

Using the correlation factors, weighted summing is performed at block 244 to construct each target data point. In some embodiments, the data space may optionally be converted at block 246 to k-space, hybrid space, or image space, such as to improve computational efficiency or to reduce image artifacts before performing the weighted sum. For example, the data space containing the data sets may be converted from k-space to hybrid space. The weighted inputs (weighted phase encoding neighbors) are then weight-summed to arrive at a value that is used to construct the missing data point This is performed for each area or point missing data, until all of the missing data has been filled at block 248.

Computer-executable instructions for generating a magnetic resonance (MR) image according to the above-described method may be stored on a form of computer readable media. Computer readable media includes volatile and nonvolatile, removable and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium which can be used to store the desired instructions and which may be accessed by MRI system 10 (shown in FIG. 1), including by internet or other computer network forms of access.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

The invention claimed is:

1. A method for processing magnetic resonance imaging data, comprising:
    accessing magnetic resonance imaging data, the magnetic resonance imaging data including a plurality of magnetic resonance data sets each collected at different excitation frequencies and defining reconstructable images representative of sections of a single image of a subject, each magnetic resonance data set including sampled data for sampled phase encoding points but missing data for unsampled phase encoding points; and
    determining at least a portion of the missing data of at least one of the magnetic resonance data sets using a correlation between the sampled data for the respective magnetic resonance data set and sampled data from at least one other magnetic resonance data set within a spectral window encompassing at least the respective magnetic resonance data set and the at least one other magnetic resonance data set;
    wherein the spectral window is adaptively determined by a computer system for the respective magnetic resonance data set.

2. The method of claim 1, comprising combining the images representative of the sections to form a final image of the subject.

3. The method of claim 2, wherein combining the images comprises performing a sum-of-squares or linear combination of magnetic resonance data sets in k-space or image space.

4. The method of claim 1, wherein the spectral window is determined for the respective magnetic resonance data set based upon a comparison between autocalibration signals sampled for the respective magnetic resonance data set and the at least one other magnetic resonance data set within the plurality of magnetic resonance data sets.

5. The method of claim 1, wherein determining the spectral window for each magnetic resonance data set comprises:
    determining a consistency between each magnetic resonance data set and at least one other magnetic resonance data set within the plurality of magnetic resonance data sets;
    selecting, for each magnetic resonance data set, the spectral window encompassing the magnetic resonance data set and at least one other magnetic resonance data set having a consistency that meets a pre-defined requirement.

6. The method of claim 1, wherein the spectral window for each image data set is determined based upon the data in k-space.

7. The method of claim 1, wherein individual points of the missing data are determined based upon the sampled data from the respective magnetic resonance data set and multiple sampled data points acquired at different excitation frequencies within the spectral window.

8. The method of claim 1, wherein determining the missing data comprises constructing the missing data iteratively to generate constructed data for each iteration, wherein in each iteration the constructed missing data is determined based upon the sampled data and constructed data from at least one previous iteration within excitation frequency bins in the spectral window.

9. The method of claim 1, wherein determining the missing data of at least one of the magnetic resonance data sets using a correlation between the sampled data for the respective magnetic resonance data set and sampled data from at least one other magnetic resonance data set within the spectral window comprises:
determining a correlation factor for the sampled data from the at least one other magnetic resonance data set based upon a pattern-driven analysis of autocalibration signals sampled for the respective magnetic resonance data set and the at least one other magnetic resonance data set; and
constructing the missing data by performing a weighted sum of the sampled data from the at least one other data set, wherein the weighting for each sampled data point is defined by the correlation factor.

10. A method for processing magnetic resonance imaging data, comprising:
accessing magnetic resonance imaging data, the data including a plurality of magnetic resonance data sets representative of a subject at different excitation frequencies, each magnetic resonance data set including sampled data for sampled phase encoding points but missing data for unsampled phase encoding points to form a sampling pattern for each magnetic resonance data set, and the sampling pattern of excitation frequency-adjacent magnetic resonance data sets differ from one another; and
determining at least a portion of the missing data of at least one of the magnetic resonance data sets using a correlation between the sampled data for the respective magnetic resonance data set and sampled data from at least one other magnetic resonance data set within a spectral window encompassing at least the respective magnetic resonance data set and the at least one other magnetic resonance data set;
wherein the spectral window is determined for each of the magnetic resonance data sets by comparing a deviation of autocalibration signals sampled for each magnetic resonance data set and at least one other magnetic resonance data set within the plurality of image data sets.

11. The method of claim 10, wherein the plurality of magnetic resonance data sets are representative of sections of the subject, each section having a respective excitation frequency, and the different excitation frequencies are determined based upon the proximity of each of the sections to a metallic structure within the subject.

12. The method of claim 11, comprising generating respective images from each of the magnetic resonance data sets after determining the missing data for each magnetic resonance data set and combining the respective images to generate a final image of the subject.

13. The method of claim 10, wherein determining the missing data of at least one of the magnetic resonance data sets using a correlation between the sampled data for the respective magnetic resonance data set and sampled data from at least one other magnetic resonance data set within the spectral window comprises:
determining a correlation factor for the sampled data from the at least one other magnetic resonance data set based upon a pattern-driven analysis of autocalibration signals sampled for the respective magnetic resonance data set and the at least one other magnetic resonance data set; and
constructing the missing data by performing a weighted sum of the sampled data from the at least one other magnetic resonance data set, wherein the weighting for each sampled data point is defined by the correlation factor.

14. A magnetic resonance imaging method, comprising:
acquiring a plurality of frequency bins using an excitation frequency progression wherein each of the frequency bins is collected at a unique excitation frequency, each bin comprising a magnetic resonance data set representative of a section of a subject, each data set including a sampling pattern having sampled locations for sampled phase encoding points and unsampled locations for unsampled phase encoding points, and the sampling patterns interleave in k-space along the excitation frequency progression to form a desired pattern;
storing the magnetic resonance data sets;
accessing the magnetic resonance imaging data;
determining at least a portion of the unsampled phase encoding points of at least one of the frequency bins based upon the sampled data for the respective frequency bin and sampled data from at least one other frequency bin within a spectral window encompassing at least the respective frequency bin and the at least one other frequency bin; and
comprising determining the spectral window for each bin;
wherein determining the spectral window comprises calculating, for each bin, a deviation value between the respective bin and the at least one other bin, wherein the deviation value is representative of the deviation between autocalibration signals sampled for the respective bin and the at least one other bin;
comparing the deviation of adjacent frequency bins for each bin; and
defining the spectral window encompassing the respective frequency bin and its adjacent frequency bins with the smallest deviation.

15. The method of claim 14, comprising generating respective images from each of the frequency bins after determining the unsampled phase encoding points for each bin and combining the respective images to generate a final image of the subject.

16. The method of claim 14, wherein determining the unsampled phase encoding points of at least one of the bins based upon the sampled data for the respective bin and sampled data from at least one other bin within the spectral window comprises:
determining a correlation factor for the sampled data from the at least one other bin based upon a pattern-driven analysis of autocalibration signals sampled for the respective bin and the at least one other bin; and constructing the missing data by performing a weighted sum of the sampled data from the at least one other bin, wherein the weighting for each sampled data is defined by the correlation factor.

17. A magnetic resonance imaging (MRI) apparatus comprising:

an MRI system having a plurality of gradient coils positioned about a bore of a magnet, and an RF transceiver system and a RF switch controlled by a pulse module to transmit RF signals to an RF coil assembly to acquire MR images; and a computer programmed to:
    access a plurality of magnetic resonance data sets, each magnetic resonance data set acquired at a different excitation frequency and including at least a set of accelerated data;
    determine a set of synthesized data for unacquired phase-encoding points for at least one of the magnetic resonance data sets using a correlation between sampled data in the set of accelerated data for the respective magnetic resonance data set and sampled data from the set of accelerated data for at least one other magnetic resonance data set within a spectral window including at least the respective magnetic resonance data set and the at least one other magnetic resonance data set; and
    generate an image using the accelerated data and the set of synthesized data for the respective magnetic resonance data set;
    wherein the spectral window is adaptively determined by a computer system for the respective magnetic resonance data set.

18. An apparatus according to claim 17, wherein the generated image represents a section of a single image of a subject.

* * * * *